(12) United States Patent
Butler (10) Patent No.: US 6,727,977 B2
(45) Date of Patent: Apr. 27, 2004

(54) LITHOGRAPHIC APPARATUS, DEVICE MANUFACTURING METHOD, AND DEVICE MANUFACTURED THEREBY

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 29 days.

(21) Appl. No.: 10/163,161

(22) Filed: Jun. 6, 2002

(65) Prior Publication Data

US 2003/0043354 A1 Mar. 6, 2003

(30) Foreign Application Priority Data

Jun. 6, 2001 (EP) .............................................. 01304950

(51) Int. Cl.⁷ .............................. G03B 27/42; G01B 4/00
(52) U.S. Cl. ......................... 355/53; 356/399; 702/150
(58) Field of Search ............................ 355/53; 356/399, 356/400, 401; 702/150

(56) References Cited

U.S. PATENT DOCUMENTS

| 5,696,590 | A | 12/1997 | Makita | 356/399 |
| 5,907,392 | A | 5/1999 | Makinouchi | 355/53 |
| 5,940,789 | A | 8/1999 | Yuan | 702/150 |
| 6,285,437 | B1 * | 9/2001 | Tokunaga | 355/53 |
| 6,373,072 | B1 * | 4/2002 | Butler et al. | 250/492.24 |

FOREIGN PATENT DOCUMENTS

| EP | 0967525 A2 | 12/1999 |
| GB | 2300275 A | 10/1996 |

OTHER PUBLICATIONS

Leang, Application of Feed . . . Lithography Stepper, ISMSS, 06/92, pp. 79–84.

* cited by examiner

Primary Examiner—Alan Mathews
(74) Attorney, Agent, or Firm—Pillsbury Winthrop LLP (57) ABSTRACT

A control system for the mask table and substrate table predicts the momentary substrate table position error and feeds it into the mask table control loop, adding it to the mask table set point and as a force to the mask table.

12 Claims, 6 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates to a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a pattering device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT patent applications WO 98/38597 and WO 98/33096, incorporated herein by reference. In the case of a programmable mirror array, the support structure may be embodied as a frame or table, for example, which may be fixed or movable as required.

Another example of a pattering device is a programmable LCD array. An example of such a construction is given in U.S. Pat. No. 5,229,872, incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792, incorporated herein by reference.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

The manufacture of ICs and other devices with such apparatus generally involves the replication of extremely fine sub-micron patterns, with an exceptionally high degree of positional accuracy. For this reason, it is essential to properly isolate various critical parts of the apparatus (such as the substrate table and mask table, for example) from spurious motion, vibration, mechanical shocks, etc. In general, this is achieved using such measures as carefully designed metrology frames, air-mounts, motional counter-weights and dampers, which serve to isolate the apparatus' critical parts from most unwanted mechanical influences. However, such measures are not completely effective in eliminating a number of unwanted influences, such as, for example:

1. vibrations in the substrate table due to leveling actions during exposure;
2. vibrations caused by motion of reticle masking blades;
3. resonance effects caused by the presence of air showers;
4. vibrations in the substrate table caused by motion of the mask table, and vice versa, and;
5. influence of air shower flow on the substrate table.

Although these effects are relatively small, they become increasingly important as the need to produce ever-higher device resolutions increases, and they now form a substantial barrier to the viable realization of large-area ICs having critical dimensions of the order of 0.15 $\mu$m and less.

Accordingly, it has been proposed in U.S. Pat. No. 6,373,072, incorporated herein by reference, to provide a control system for the substrate and mask tables of a lithographic apparatus in which errors in the position of the substrate table are compensated for by their inclusion as a feed-forward control in the mask table control loop. Specifically, the substrate table error is lowpass filtered, the output of the filter is then added to the mask table setpoint, and also twice differentiated, multiplied by the mask table mass and the resultant force applied to the mask table. This proposal is based on the realization that the absolute positions of the mask and substrate tables are less important than their relative position and allows the correction of substrate table errors beyond the mask table bandwidth. However, this control system has performance limits, in part caused by the inevitable time delay in processing the substrate table error.

SUMMARY OF THE INVENTION

It is an aspect of the present invention to provide an improved control system for the support structure for the patterning device, e.g. a mask, and substrate tables of a lithographic projection apparatus.

This and other aspects are achieved according to the invention in a lithographic apparatus including a radiation system constructed and arranged to provide a projection beam of radiation; a support structure constructed and arranged to support a patterning device, the patterning device constructed and arranged to pattern the projection beam according to a desired pattern; a substrate table to hold a substrate; a projection system constructed and arranged to project the patterned beam onto a target portion of the substrate; a first driving device constructed and arranged to move the support structure in a given reference direction substantially parallel to the plane of the patterning device; a second driving device constructed and arranged to move the substrate table parallel to the reference direction so as to be synchronous with the motion of the support structure; a first measuring device constructed and arranged to determine the momentary position of the patterning device with respect to a fixed reference point; a second measuring device and constructed and arranged to determine the momentary position of the substrate table with respect to a fixed reference point; a comparing device constructed and arranged to compare the measured momentary position of the substrate table with a desired momentary position of the substrate table to generate a position error signal in accordance with a difference between the two positions; and a predictor constructed and arranged to generate a future position error signal based on one or more previous position error signals and pass that future position error signal to a correction device constructed and arranged to adjust the momentary position of the patterning device so as to compensate for such difference.

With the present invention, the drawbacks of the prior art are avoided and a improvement of 30 to 50% in the high-frequency synchronization error between the substrate and mask tables can be achieved. Preferably, the prediction is a sine-based prediction which can readily be adapted to predict the second derivative of the position error signal thereby directly providing the basis for an acceleration error signal. Such a sine-based prediction can advantageously be implemented using one or more finite impulse response (FIR) filters.

According to a further aspect of the invention there is provided a device manufacturing method including providing a substrate that is at least partially covered by a layer of radiation-sensitive material; providing a projection beam of radiation using a radiation system using a patterning device to endow the projection beam with a pattern in its cross-section; projecting the patterned beam of radiation onto a target portion of the layer of radiation-sensitive material, wherein the projecting moving a support structure supporting the patterning device in a given reference direction substantially parallel to the plane of the patterning device; moving the substrate table parallel to the reference direction so as to be synchronized with the motion of the support structure; determining the momentary position of the mask table with respect to a fixed reference point; determining the momentary position of the substrate table with respect to a fixed reference point; comparing the measured momentary position of the substrate table with a desired momentary position of the substrate table to generate a position error signal in accordance with a difference between the two positions; predicting a future position error based on one or more previous position error signals; and adjusting the momentary position of the mask table so as to compensate for such difference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIGS. 3A and B are graphs of the magnitude and phase of the transfer functions of sine-based extrapolation predictors used in the first embodiment of the invention;

FIGS. 5A and B are graphs of the magnitudes and phases of the transfer functions of a control system according to the invention and two prior art control systems;

FIGS. 7A and B are graphs of the magnitude and phase of the transfer functions of sine-based double derivative predictors used in a second embodiment of the invention;

FIGS. 10A and B are graphs of the magnitude and phase of the transfer functions of polynomial extrapolation predictors used in a third embodiment of the invention.

In the Figures, corresponding reference symbols indicate corresponding parts.

DETAILED DESCRIPTION

Figure 1:
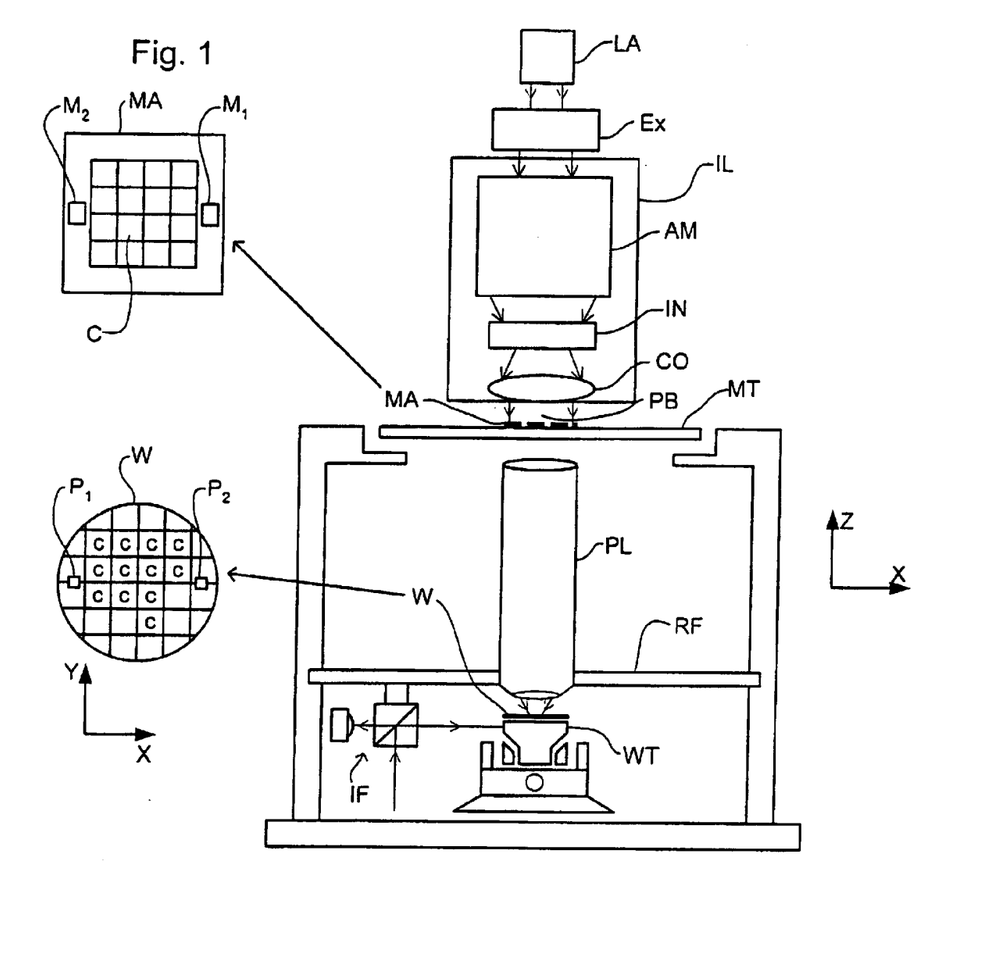
FIG. 1 depicts a lithographic projection apparatus according to an embodiment of the invention.

FIG. 1 schematically depicts a lithographic projection apparatus according to a particular embodiment of the invention. The apparatus includes a radiation system Ex, IL, constructed and arranged to supply a projection beam PB of radiation (e.g. UV radiation), which in this particular case also comprises a radiation source LA; a first object table (mask table) MT provided with a mask holder for holding a mask MA (e.g. a reticle), and connected to a first positioning device $M_1$, $M_2$ constructed and arranged to accurately position the mask with respect to a projection system PL; a second object table (substrate table) WT provided with a substrate holder to hold a substrate W (e.g. a resist-coated silicon wafer), and connected to a second position device $P_1$, $P_2$ constructed and arranged to position the substrate with respect to the projection system PL; the projection system ("lens") PL (e.g. a refractive lens system) constructed and arranged to image an irradiated portion of the mask MA onto a target portion C (e.g. comprising one or more dies) of the substrate W. As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. an Hg lamp or excimer laser) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second position device $P_1$, $P_2$ (and interferometrer IF), the substrate table WT can be moved accurately, e.g. so as to position different target portions C in the path of the beam PB. Similarly, the first positioning device $M_1$, $M_2$ can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
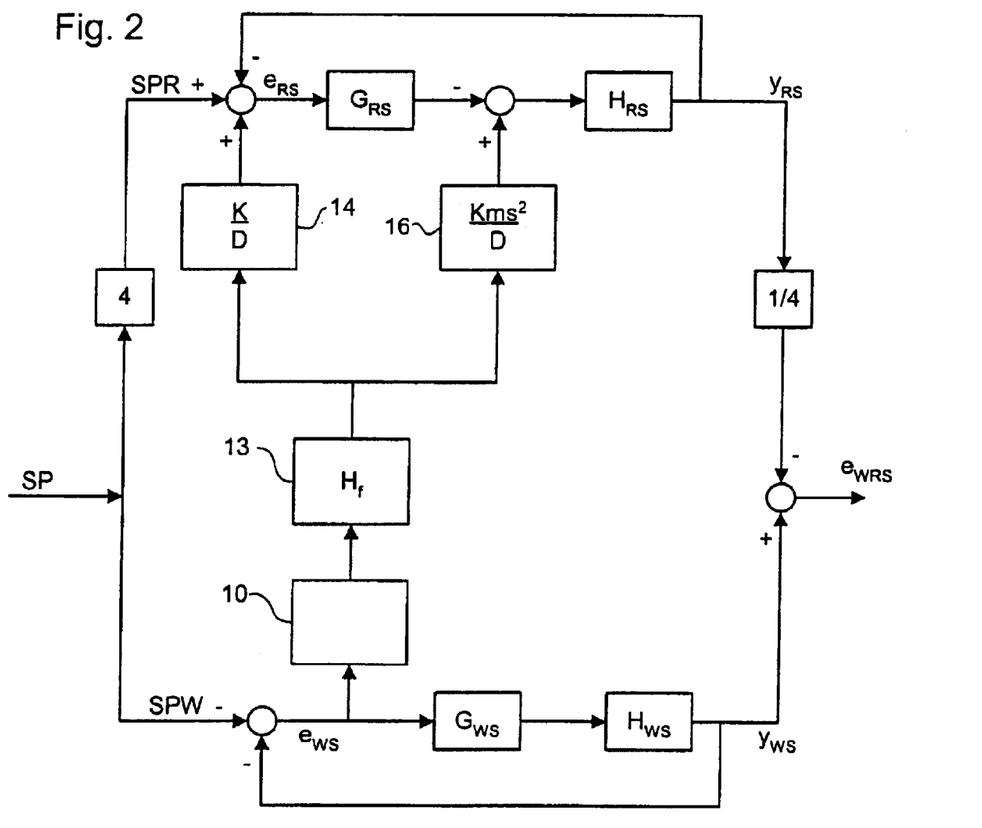
FIG. 2 is a control theory circuit suitable for implementation in a first embodiment of the invention.

FIG. 2 depicts a control theory diagram of a control system used in an apparatus according to a first embodiment of the invention. The top loop represents the mask table (or reticle stage) RS, consisting of the mechanical transfer $H_{RS}$ and controller $G_{RS}$. The bottom loop is the substrate table (or wafer stage) WS, consisting of the mechanical transfer $H_{WS}$ and controller $G_{WS}$. The mask table receives a setpoint SPR which is four times the setpoint SPW of the substrate table, while its output only counts ¼ in the relevant WS/RS error, reflecting the fact that the pattern image is projected by the projection system PL with a magnification M=¼ and that the mask table scans at four times the speed of the substrate.

Via a predictor 10 described further below, the substrate table error $e_{WS}$ is added to the mask table setpoint SPR, and a substrate table acceleration error is generated. This error is combined with the output of the mask table controller $G_{RS}$ so that an extra force is generated which, when applied to the mask stage, should give it four times the acceleration of the substrate table. When applied on its own, the mask table controller $G_{RS}$ would consider this force a disturbance, and would react and try to diminish the effect of the feedforward. By additionally feeding the predicted substrate table error $e_{ws}$ to the mask table setpoint, this problem is solved. Now, if the mask table reacts to the extra feedforward force as a transfer $1/ms^2$, the mask stage error $e_{RS}$ remains zero and hence the mask stage controller is left "unaware" of any extra force injection.

Figure 5:
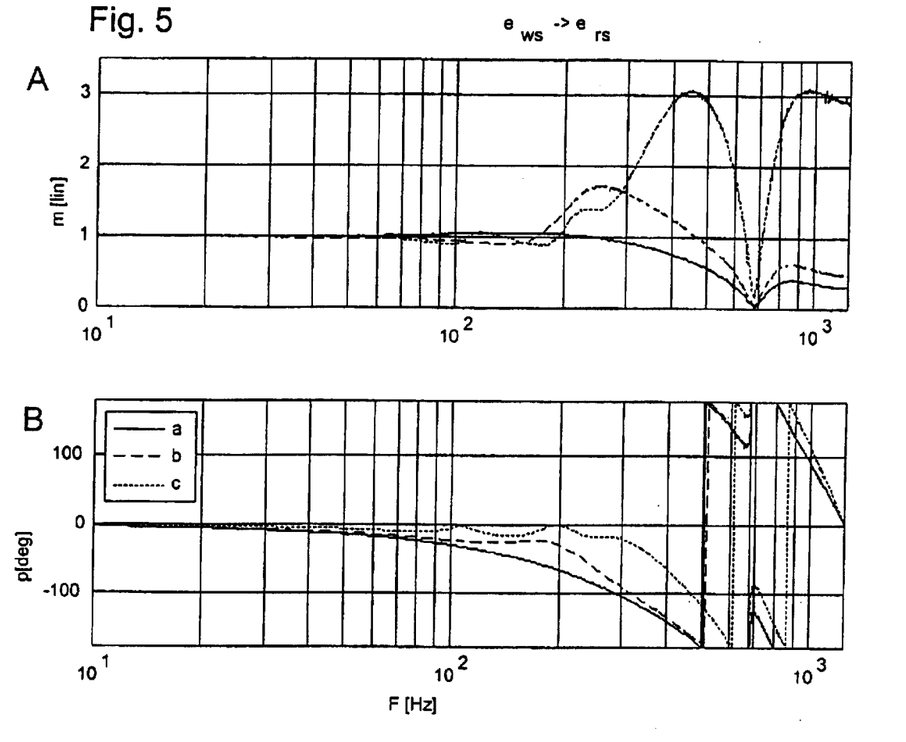

Details of the predictor 10 will now be explained with reference to FIGS. 5 to 7. The predictor 10 employs a prediction by sine-fit method which assumes a limited number of dominant frequencies in the signal to be predicted. Assume that the substrate table position error $e_{WS}$ consists of m sinusoids with unknown amplitude and phase, but with known frequencies:

$$y(t) = \sum_{i=1...m} a_i \sin(2\pi f_i t) + b_i \cos(2\pi f_i t) \quad (1)$$

Further, assume that n samples in the past are used to fit the data on. With two dominant frequencies $f_2$ and $f_2$, the following equation arises:

$$\begin{pmatrix} \sin(2\pi f_1 t_1) & \cos(2\pi f_1 t_1) & \sin(2\pi f_2 t_1) & \cos(2\pi f_2 t_1) \\ \sin(2\pi f_1 t_2) & \cos(2\pi f_1 t_2) & \sin(2\pi f_2 t_2) & \cos(2\pi f_2 t_2) \\ \vdots & \vdots & \vdots & \vdots \\ \sin(2\pi f_1 t_n) & \cos(2\pi f_1 t_n) & \sin(2\pi f_2 t_n) & \cos(2\pi f_2 t_n) \end{pmatrix} \begin{pmatrix} a_1 \\ b_1 \\ a_2 \\ b_2 \end{pmatrix} = \begin{pmatrix} y(t_1) \\ y(t_2) \\ \vdots \\ y(t_n) \end{pmatrix} \quad (2)$$

$$Ax = b \quad (3)$$

Hence, for n>4, an over-determined system arises with more equations than unknowns. Using a least-squares algorithm, $a_1$, $a_2$, $b_1$, $b_2$ can be solved. For n=4, four equations with four unknowns arise, that can be solved analytically by inverting the above matrix. Hence, in an on-line prediction situation, every sample the above 4×4 matrix must be generated, inverted, and multiplied with the y-vector containing the last 4 samples of the data to be predicted. The resulting a and b coefficients can then be used to predict the value of y at the next sample $t_0$:

$$\hat{y}(t_0)=a_1 \sin(2\pi f_1 t_0)+b_1 \cos(2\pi f_1 t_0)+a_2 \sin(2\pi f_2 t_0)+b_2 \cos(2\pi f_2 t_0) \quad (4)$$

A computationally more efficient way for the case that the matrix is square (n=2m), lies in a better choice of the time scale. The time scale is shifted such that at the prediction target time instant t is defined as 0. The time scale hence shifts each sample. The current sample y(t1) is inserted into the algorithm as if it belongs to a point on the time scale at t=−Ts, y(t2) belongs to t=−2Ts, and so on. There is no reason to keep the time scale absolute, and in this case it is advantageous to shift it each sample such that the time instant of the predicted value coincides with t=0 on the time scale. In that case:

1. The A matrix becomes constant and can be constructed and inverted off-line.
2. Finding the predicted value only involves adding b1 and b2, because the time instant one sample in the future is at t=0.

Finding the 1-sample prediction then actually boils down to calculating a third-order FIR filter:

$$\hat{y}(k+1)=(c_{21}+c_{41})y(k)+(c_{22}+c_{42})y(k-1)+(c_{23}+c_{43})y(k-2)+(c_{24}+c_{44})y(k-3) \quad (5)$$

$c_{ij}$ being the $(i, j)^{th}$ coefficient of $A^{-1}$.

Figure 3:
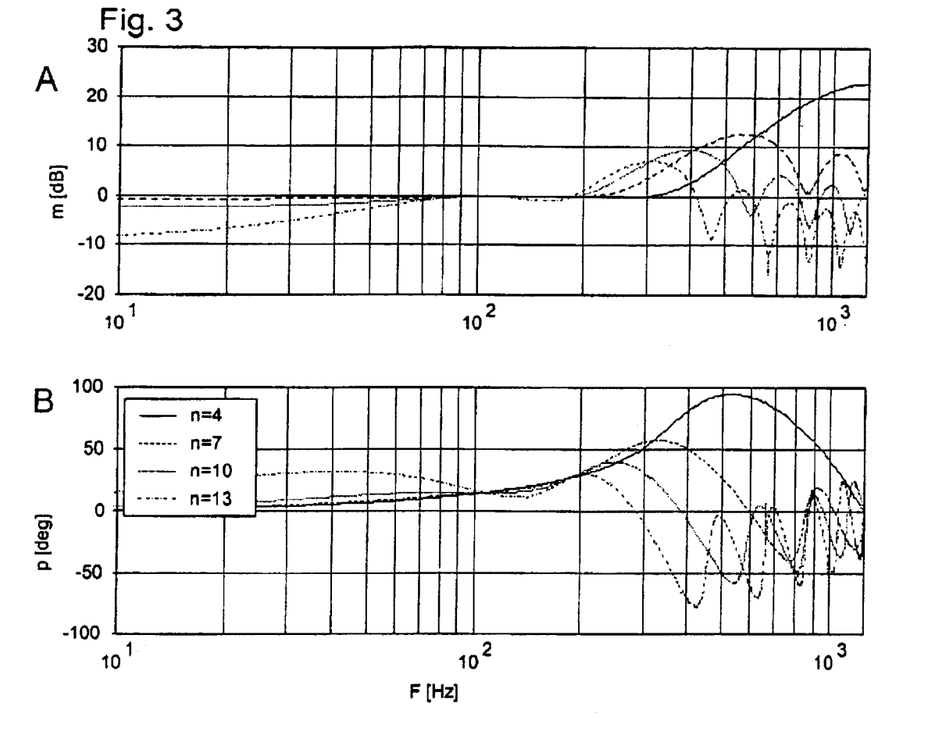

FIGS. 3A and B show the magnitude and phase respectively of the frequency response of this predictor for various values of n. At 107 and 185 Hz, the chosen prediction frequencies $f_1$ and $f_2$, amplitude and phase are always correct (prediction is exact). At other frequencies the result is undefined, but for n=4 (minimum) the result is still good.

It will be appreciated that the DC gain can be forced to 1 by adding a column vector containing 1's at the right side of the matrix A, and adding one offset coefficient c to the vector containing a and b coefficients. The signal y is then supposed to include a DC component:

$$y(t) = c + \sum_{i=1...m} a_i \sin(2\pi f_i t) + b_i \cos(2\pi f_i t) \quad (6)$$

n must then be 2m+1, minimum.

Also, choosing more base sinusoids requires a larger n, which generally leads to a less favorable amplitude/phase behavior. Further, the prediction horizon can have any value and is not restricted to whole number of samples. This is achieved by shifting the time scale.

The implementation of this is shown in FIG. 2. The predictor receives the substrate table position error $e_{ws}$ and predicts its value one sample in the future based on the chosen prediction frequencies. The predictor is implemented as a $4^{th}$-order FIR filter (two prediction frequencies+a DC component). The predictor output is refined in the frequency domain by one or more conventional filters depicted by the block '$H_{Filter}$'. The output of $H_{Filter}$ is filtered by low-pass filter 14, with a gain of −4, and added to the mask table setpoint SPR. Also, the output of $H_{Filter}$ is double-differentiated, multiplied by the mask table mass m, filtered by a low-pass filter 16 which has the same characteristics as low-pass filter 14, and added to the mask table controller output.

Figure 4:
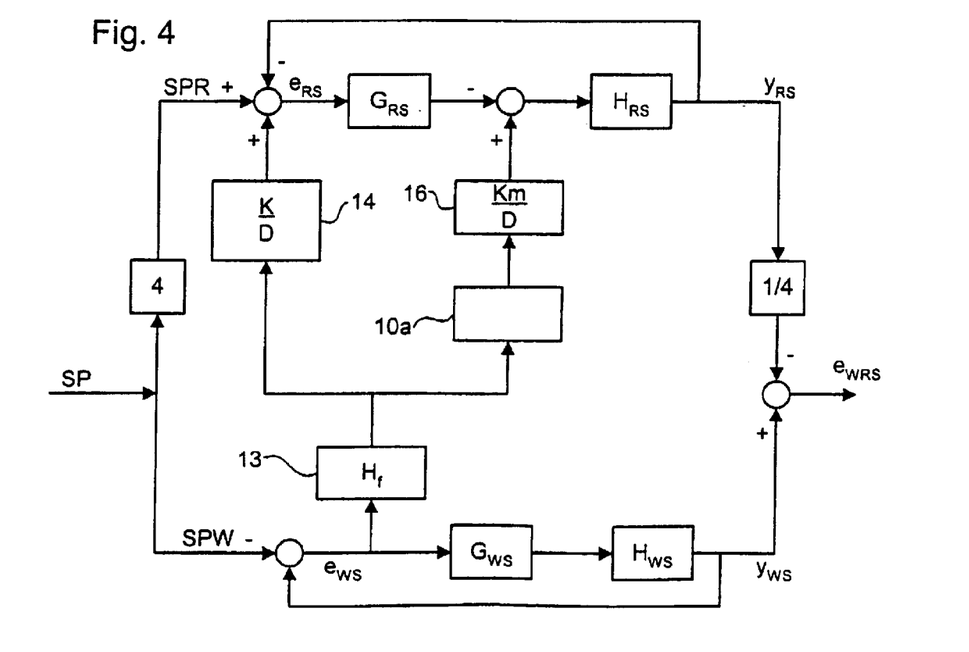
FIG. 4 is a control theory circuit suitable for implementation in a second embodiment of the invention.

According to a second embodiment of the invention, which is shown in FIG. 4 and is otherwise the same as the first embodiment, the predictor is used to predict the second derivative of y by evaluating:

$$\frac{d^2 y(t)}{dt^2} = \sum_{i=1...m} -a_i(2\pi f_i)^2 \sin(2\pi f_i t) - b_i(2\pi f_i)^2 \cos(2\pi f_i t) \quad (7)$$

Hence, the only difference is the determination of the FIR filter parameters.

Special care must be taken for the lower frequencies. FIGS. 7A and B show the response of the double-derivative predictor when making use of the same base frequencies as in the first embodiment: 107 and 185 Hz. It can be seen that below 107 Hz, the magnitude becomes flat, while a +2 slope is required. To repair this behavior, a very low frequency of 1 rad/s is included in the base frequencies, forcing a proper response for lower frequencies as also shown in FIGS. 7A and B. Introducing a DC gain of 0 does not help here, because this can also be obtained by a +1 slope. A low, nonzero extra base frequency is therefore required. The cost is, again, a larger high-frequency gain.

Figure 8:
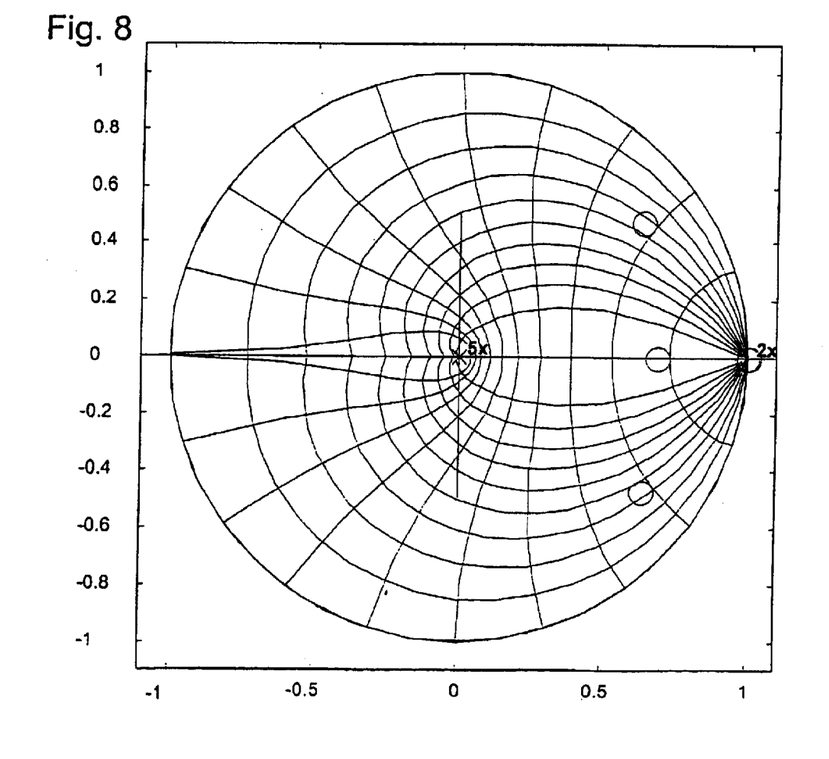
FIG. 8 is a pole zero map of a double derivative predictor used in the second embodiment of the invention.

FIG. 8 shows the discrete poles and zeros of the FIR filter that results from this design technique. A straightforward double differentiator has two zeros in z=+1 and two poles in z=0. The sine-fit predictor creates three pole/zero pairs at strategic locations. Note that this filter has no continuous-time counterpart.

The implementation of this is shown in FIG. 4. The substrate table position error $e_{ws}$ is fed through the block '$H_{Filter}$', which refines the phase at specific frequencies present in the substrate table position error. The output of $H_{Filter}$ is filtered by low-pass filter 14, with a gain of −4, and added to the mask table setpoint SPR. Also, the output of $H_{Filter}$ is fed to the acceleration error predictor, which predicts the substrate table acceleration error in the future. The predictor is implemented as a $5^{th}$-order FIR filter (three prediction frequencies, of which one is kept very low to force a correct low-frequency behaviour). The predictor output is multiplied by the mask table mass m, filtered by a low-pass filter 16 which has the same characteristics as low-pass filter 14, and added to the mask table controller output.

Figure 6:
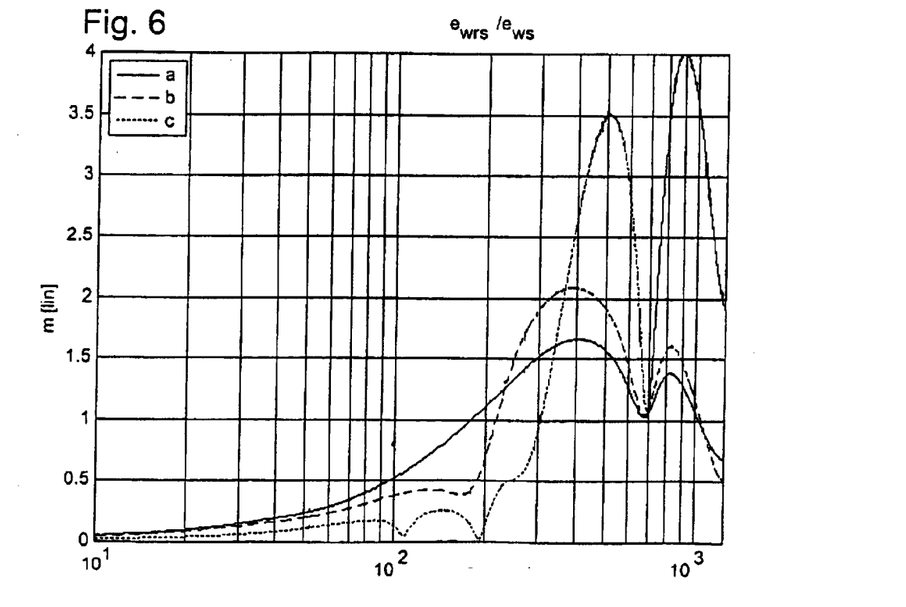
FIG. 6 is a graph of the feedthrough factors of a control system according to the invention and two prior art control systems.
Figure 7:
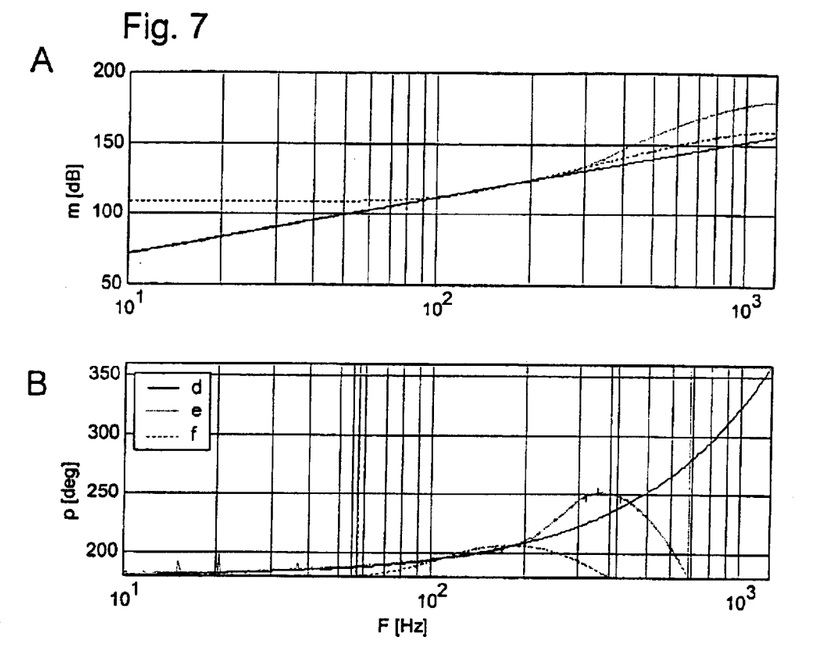

FIGS. 5A, 5B and 6 illustrate the improvement obtained with the predictor of the present invention. FIGS. 5A and B show the magnitude and phase of the transfer function $y_{rs}/e_{WS}$ for the prior art arrangement a) without optimal conventional filters (solid line), b) the prior art with optimal conventional filters (long dashed line) and c) the present embodiment (short dashed line). It will be seen that the transfer function of the present invention using a predictor is much closer to the ideal of magnitude=1 in FIG. 5A and 0 phase lag in FIG. 5B for all relevant frequencies below 300 Hz. The feedthrough factor $e_{wRS}/e_{WS}$ is shown in FIG. 6. In this Figure, 0 is ideal while values below 1 denote improvement and values above 1 denote degradation. It will be seen that introduction of the prediction of the present invention improves the feedthrough factor at frequencies up to about 350 Hz compared to the prior art at the cost of some increase at higher frequencies, which are less important.

The effect on the feedthrough mechanism is shown in FIGS. 5A, B and 6, as discussed above. At dominant frequencies in $e_{WS}$, the feedthrough factor has improved a great deal, at the cost of a larger high-frequency gain.

Results for moving average (MA) and moving standard deviation (MSD) are shown in the table, which also includes the best-obtained results using lead-lag filters only.

|  | MA-X [nm] | MA-Y [nm] | MSD-X [nm] | MSD-Y [nm] |
|---|---|---|---|---|
| $e$WS | 8.7 | 20.2 | 20.9 | 31.3 |
| $e$WRS, original | 2.2 | 2.9 | 11.6 | 9.4 |
| $e$WRS, lead-lag filters | 1.9 | 2.3 | 8.1 | 7.5 |
| $e$WRS, acc. predictor | 1.5 | 1.9 | 6.8 | 6.3 |

In a third embodiment of the invention, which is otherwise the same as the first embodiment, the sine-based predictor is replaced by a predictor based on a polynomial extrapolation of previous data points.

Figure 9:
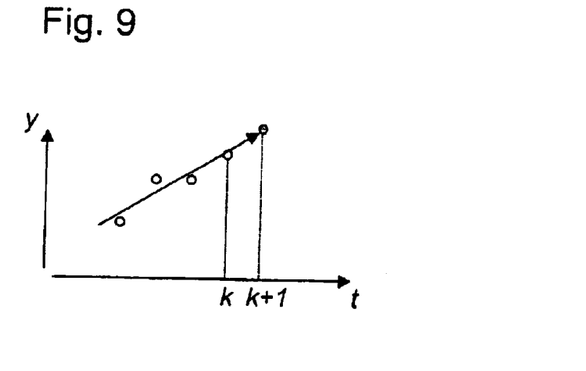
FIG. 9 is a graph used to illustrate polynomial extrapolation.

On the last n samples a polynomial can be fitted (having a maximum order of (n−1)), that can be used for extrapolation to the next sample. A basic example is shown in FIG. 9. Here, the last four samples are used to fit a straight line through, that is used to predict the next sample.

Figure 10:
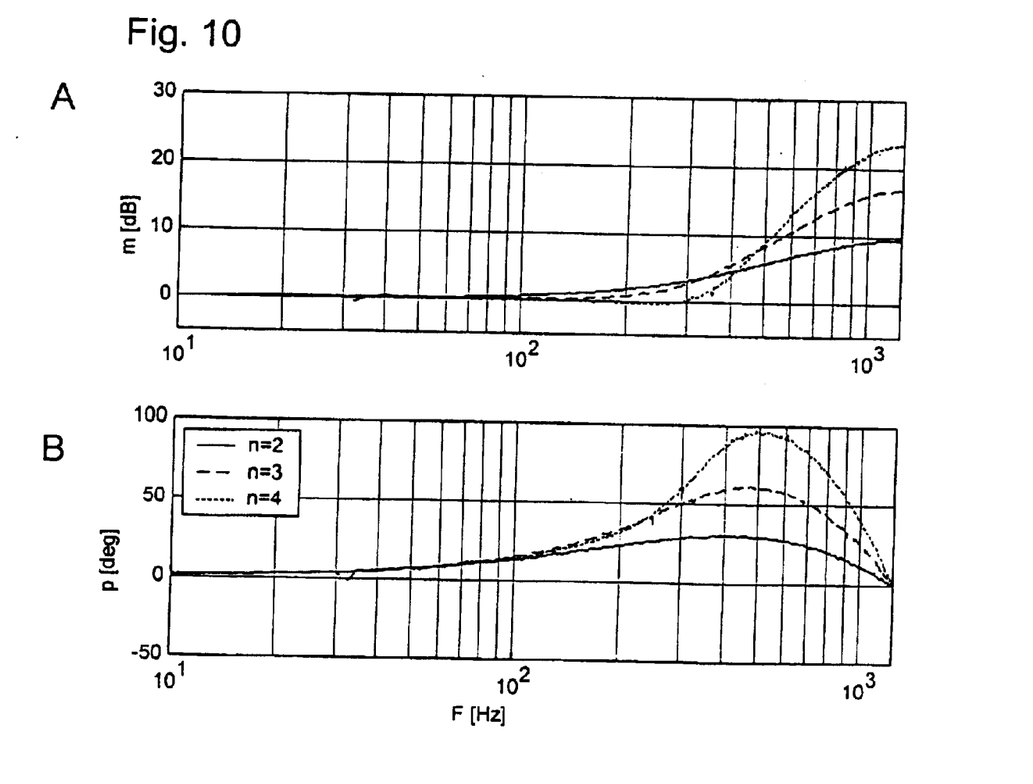

Experiments showed that it is not useful to use more than the minimum required number of past datapoints. Using more points introduces an unfavorable phase lag. Hence, using n points in the past, using an (n−1)th-order polynomial is the best one can do. FIGS. 10A and B show the frequency response for various values of n. It is seen that the 3rd-order polynomial is flat up to around 300 Hz, above which a large gain occurs. The larger the polynomial order, the better the phase advantage, but also the larger the high-frequency gain. This is true in general: a large phase advantage is combined with unfavorable high-frequency gain.

While specific embodiments of the invention have been described above, it will be appreciated that the invention may be practiced otherwise than as described. For example, the invention may be applied in reverse, i.e. with the position error of the patterning device (e.g. mask table) predicted and fed into the control of the substrate table. The description is not intended to limit the invention.

What is claimed is:

1. A lithographic projection apparatus, comprising:
   a radiation system constructed and arranged to provide a projection beam of radiation;
   a support structure constructed and arranged to support a patterning device, the patterning device constructed and arranged to pattern the projection beam according to a desired pattern;
   a substrate table to hold a substrate;
   a projection system constructed and arranged to project the patterned beam onto a target portion of the substrate,
   a first driving device constructed and arranged to move the support structure in a given reference direction substantially parallel to the plane of the patterning device;
   a second driving device constructed and arranged to move the substrate table parallel to the reference direction so as to be synchronous with the motion of the support structure;
   a first position measuring device constructed and arranged to determine the momentary position of the patterning device with respect to a fixed reference point;
   a second position measuring device constructed and arranged to determine the momentary position of the substrate table with respect to a fixed reference point;
   a position comparator constructed and arranged to compare the measured momentary position of the substrate table with a desired momentary position of the substrate table to generate a position error signal in accordance with a difference between the two positions; and
   a position error predictor that generates a future position error signal based on one or more previous position error signals; and
   a position correction device that adjusts the momentary position of the patterning device based upon the future position error signal.

2. An apparatus according to claim 1, wherein the position error predictor is adapted to predict a first or higher derivative of the position error signal.

3. An apparatus according to claim 1, wherein the position error predictor comprises a sine-based predictor operating on n previous samples of the position error signal.

4. An apparatus according to claim 1, wherein the position error predictor is adapted to effect a polynomial prediction based on n previous samples of the position error signal.

5. An apparatus according to claim 3, wherein the position error predictor comprises a finite impulse response filter.

6. An apparatus according to claim 3, wherein n is the minimal value required to obtain a full and sufficient set of equation.

7. An apparatus according to claim 1, wherein the support structure comprises a mask table to hold a mask.

8. An apparatus according to claim 1, wherein the radiation system comprises a radiation source.

9. A lithographic projection apparatus, comprising:
- a radiation system constructed and arranged to provide a projection beam of radiation;
- a support structure constructed and arranged to support a patterning device, the patterning device constructed and arranged to pattern the projection beam according to a desired pattern;
- a substrate table to hold a substrate;
- a projection system constructed and arranged to project the patterned beam onto a target portion of the substrate;
- a first driving device constructed and arranged to move the support structure in a given reference direction substantially parallel to the plane of the patterning device;
- a second driving device constructed and arranged to move the substrate table parallel to the reference direction so as to be synchronous with the motion of the support structure;
- a first position measuring device constructed and arranged to determining the momentary position of the patterning device with respect to a fixed reference point;
- a second position measuring device constructed and arranged to determine the momentary position of the substrate table with respect to a fixed reference point;
- a position comparator constructed and arranged to compare the measured momentary position of the patterning device with a desired momentary position of the patterning device to generate a position error signal in accordance with a difference between the two positions; and
- a position error predictor that generates a future position error signal based on one or more previous position error signals; and a position correction device that adjusts the momentary position of the substrate table based upon the future position error signal.

10. A device manufacturing method, comprising:
- providing a substrate that is at least partially covered by a layer of radiation-sensitive material;
- providing a projection beam of radiation using a radiation system;
- using a patterning device to endow the projection beam with a pattern in its cross-section;
- projecting the patterned beam of radiation onto a target portion of the layer of radiation-sensitive material, wherein the projecting comprises moving a support structure supporting the patterning device in a given reference direction substantially parallel to the plane of the patterning device;
- moving the substrate table parallel to the reference direction so as be synchronized with the motion of the support structure;
- determining the momentary position of the mask table with respect to a fixed reference point;
- determining the momentary position of the substrate table with respect to a fixed reference point;
- comparing the measured momentary position of the substrate table with a desired momentary position of the substrate table to generate a position error signal in accordance with a difference between the two positions; and
- predicting a future position error based on one or more previous position error signals and adjusting the momentary position of the mask table so as to compensate for such difference.

11. A device manufactured according to the method of claim 10.

12. An apparatus according to claim 4, wherein the position error predictor comprises a finite impulse response filter.

* * * * *